(12) United States Patent
Nakamori

(10) Patent No.: US 12,068,676 B2
(45) Date of Patent: Aug. 20, 2024

(54) SWITCHING CONTROL CIRCUIT FOR OVERCURRENT PROTECTION, AND SEMICONDUCTOR DEVICE CONTAINING THE SAME

(71) Applicant: FUJI ELECTRIC CO., LTD., Kawasaki (JP)

(72) Inventor: Akira Nakamori, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 189 days.

(21) Appl. No.: 17/559,574

(22) Filed: Dec. 22, 2021

(65) Prior Publication Data

US 2022/0116032 A1    Apr. 14, 2022

Related U.S. Application Data

(63) Continuation of application No. PCT/JP2020/043533, filed on Nov. 24, 2020.

(30) Foreign Application Priority Data

Jan. 10, 2020 (JP) .................................. 2020-002615

(51) Int. Cl.
*H02M 1/08* (2006.01)
*H02M 1/00* (2007.01)
(Continued)

(52) U.S. Cl.
CPC ........... *H02M 1/08* (2013.01); *H02M 1/0009* (2021.05); *H02M 1/32* (2013.01); *H02M 7/53871* (2013.01); *H03K 17/0828* (2013.01)

(58) Field of Classification Search
CPC ........ H02M 1/08; H02M 1/0009; H02M 1/32; H03K 17/165; H03K 17/168; H03K 17/16;
(Continued)

(56) References Cited

U.S. PATENT DOCUMENTS 5,929,665 A * 7/1999 Ichikawa ............. H03K 17/168
327/109
6,717,785 B2 * 4/2004 Fukuda .............. H03K 17/0828
361/86
(Continued)

FOREIGN PATENT DOCUMENTS

JP    2012-023899 A    2/2012
JP    2014-045598 A    3/2014
(Continued)

OTHER PUBLICATIONS

International Search Report for PCT/JP2020/043533, mailed on Jan. 26, 2021.

*Primary Examiner* — Gustavo A Rosario-Benitez
(74) *Attorney, Agent, or Firm* — Rabin & Berdo, P.C.

(57) ABSTRACT

A switching control circuit configured to control a switching device. The switching control circuit includes a detection circuit configured to detect whether a current flowing through the switching device is in an overcurrent state, a first signal output circuit configured to output a first signal indicating whether a time period of the overcurrent state is longer than a first time period, and a driving circuit. The driving circuit turns on the switching device based on a first input signal. The driving circuit turns off the switching device through a first switch based on a second input signal when the time period of the overcurrent state is shorter than the first time period, and through a second switch, having a greater on-resistance than the first switch, based on the second input signal and the first signal when the time period of the overcurrent state is longer than the first time period.

9 Claims, 7 Drawing Sheets

(51) Int. Cl.
*H02M 1/32* (2007.01)
*H02M 7/5387* (2007.01)
*H03K 17/082* (2006.01)

(58) Field of Classification Search
CPC ............ H03K 17/082; H03K 17/0822; H03K 17/0826; H03K 17/0828
See application file for complete search history.

(56) References Cited

U.S. PATENT DOCUMENTS

| | | | | |
|---|---|---|---|---|
| 7,746,614 | B2* | 6/2010 | Ishikawa | ............ H03K 17/0828 |
| | | | | 361/87 |
| 9,748,942 | B2* | 8/2017 | Akahane | ............ H03K 17/0828 |
| 10,770,888 | B2* | 9/2020 | Minagawa | ......... H03K 17/0828 |
| 2007/0064364 | A1* | 3/2007 | Tuchihashi | ........ H03K 17/0822 |
| | | | | 361/90 |
| 2007/0183171 | A1* | 8/2007 | Niijima | ............. H02M 3/33507 |
| | | | | 363/21.04 |
| 2012/0013370 | A1 | 1/2012 | Mori | |
| 2013/0094114 | A1* | 4/2013 | Shimizu | ............... H03K 17/567 |
| | | | | 361/87 |
| 2013/0265684 | A1* | 10/2013 | Fujikawa | ................ H02H 3/08 |
| | | | | 361/87 |
| 2017/0358982 | A1* | 12/2017 | Nakamori | ............... H02M 1/08 |
| 2018/0115310 | A1* | 4/2018 | Horiguchi | ............ H03K 17/168 |
| 2019/0363706 | A1* | 11/2019 | Shinomiya | ........... H03K 17/145 |

FOREIGN PATENT DOCUMENTS

| | | |
|---|---|---|
| JP | 2015-201980 A | 11/2015 |
| JP | 2016-019096 A | 2/2016 |

* cited by examiner

SWITCHING CONTROL CIRCUIT FOR OVERCURRENT PROTECTION, AND SEMICONDUCTOR DEVICE CONTAINING THE SAME

CROSS-REFERENCE TO RELATED APPLICATIONS

This is a continuation application of International Patent Application No. PCT/JP2020/043533 filed Nov. 24, 2020, which claims the benefit of priority to Japanese Patent Application No. 2020-002615 filed Jan. 10, 2020, the entire contents of each of which are incorporated herein by reference.

BACKGROUND

Technical Field

The present disclosure relates to a switching control circuit and a semiconductor device.

Description of the Related Art

There have been overcurrent protection circuits to protect a switching device from an overcurrent flowing through the switching device (refer to, for example, Japanese Patent Application Publication No. 2014-45598).

In general, some of the overcurrent protection circuits turn off the switching device when an overcurrent continues flowing for a predetermined time period. However, since the overcurrent protection circuits do not work until the predetermined time period elapses, the switching device may be broken in some cases. If the predetermined time period is shortened in order to prevent the breakage of the switching device, the overcurrent protection circuits may operate in response to a noise component.

The present disclosure is directed to provision of a switching control circuit that is capable of properly protecting a switching device from an overcurrent.

SUMMARY

A first aspect of an embodiment of the present disclosure presents a switching control circuit configured to control switching of a switching device, comprising: a detection circuit configured to detect whether a current flowing through the switching device is in an overcurrent state; a first signal output circuit configured to output a first signal indicating whether a time period of the overcurrent state is longer than a first time period; and a driving circuit including a first switch, and a second switch having an on-resistance greater than that of the first switch, the driving circuit being configured to turn on the switching device based on a first input signal to turn on the switching device, turn off the switching device through the first switch based on a second input signal to turn off the switching device when the time period of the overcurrent state is shorter than the first time period, and turn off the switching device through the second switch based on the second input signal and the first signal, when the time period of the overcurrent state is longer than the first time period.

A second aspect of an embodiment of the present disclosure presents a switching control circuit configured to control switching of a switching device, comprising: a detection circuit configured to detect an overcurrent state in which a current flowing through the switching device is greater than a predetermined current; a first signal output circuit configured to output a first signal indicating whether a time period of the overcurrent state is longer than a first time period; a second signal output circuit configured to output a second signal indicating whether the time period of the overcurrent state is longer than a second time period, the second time period being longer than the first time period; and a driving circuit including a first switch, and a second switch having an on-resistance greater than that of the first switch, the driving circuit being configured to drive the switching device based on the first and second signals, a first input signal to turn on the switching device, and a second input signal to turn off the switching device, by when the time period of the overcurrent state is longer than the second time period, turning off the switching device based on the second signal regardless of the first and second input signals, when the time period of the overcurrent state is shorter than the first time period, turning on the switching device based on the first input signal, and turning off the switching device through the first switch based on the second input signal, and when the time period of the overcurrent state is longer than the first time period but shorter than the second time period, turning on the switching device based on the first input signal, and turning off the switching device through a second switch based on the first signal and the second input signal.

A third aspect of an embodiment of the present disclosure presents semiconductor device, comprising: a switching device; a detection circuit configured to detect whether a current flowing through the switching device is in an overcurrent state; a first signal output circuit configured to output a first signal indicating whether a time period of the overcurrent state is longer than a first time period; and a driving circuit including a first switch, and a second switch having an on-resistance greater than that of the first switch, the driving circuit being configured to turn on the switching device based on a first input signal to turn on the switching device, turn off the switching device through the first switch based on a second input signal to turn off the switching device when the time period of the overcurrent state is shorter than the first time period, and turn off the switching device through the second switch based on the second input signal and the first signal, when the time period of the overcurrent state is longer than the first time period.

DETAILED DESCRIPTION

At least following matters will become apparent from the descriptions of the present specification and the accompanying drawings.

Present Embodiments

Figure 1:
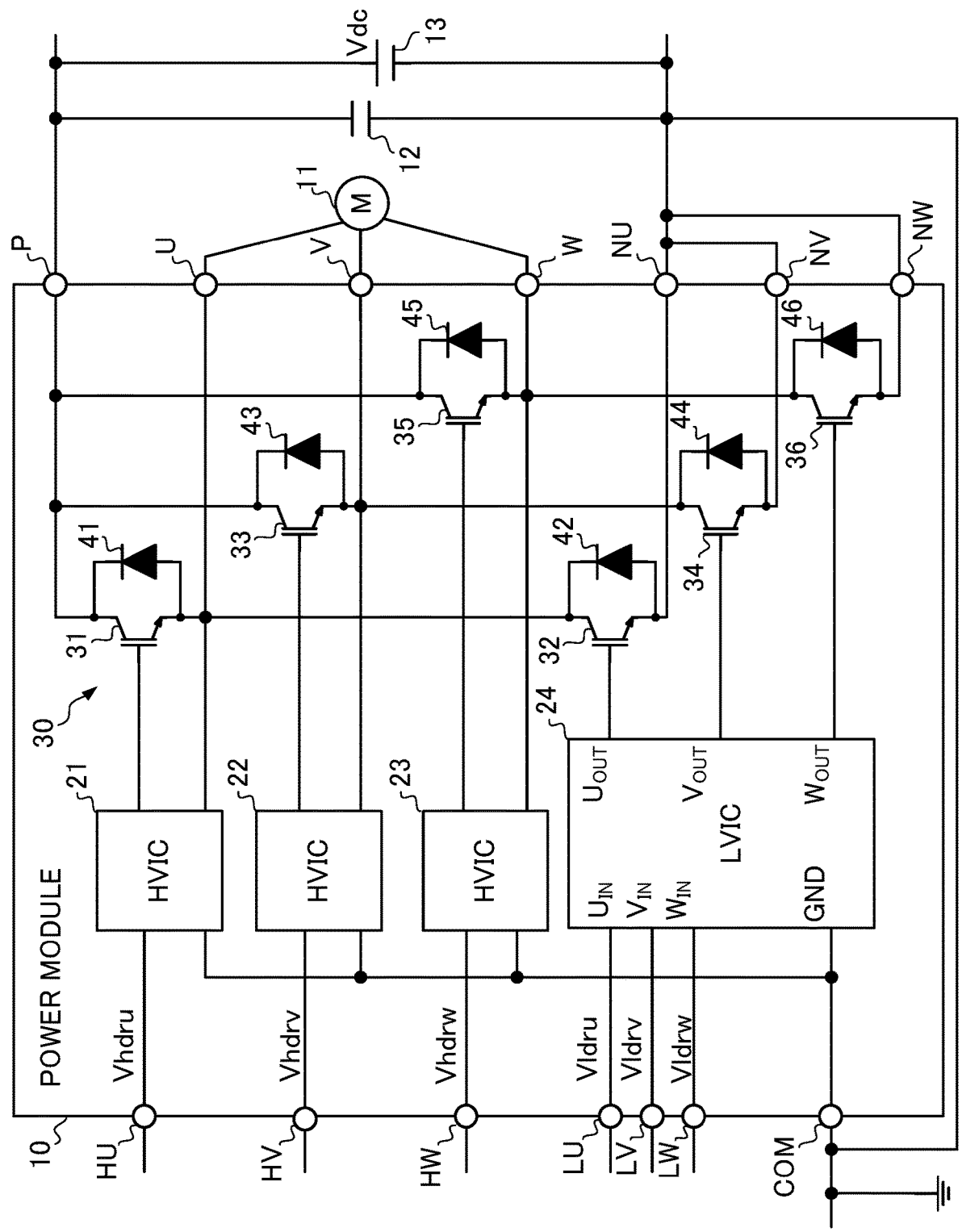
FIG. 1 is a diagram illustrating an example of a configuration of a power module 10.

FIG. 1 is a diagram illustrating an example of a configuration of a power module 10 that is an embodiment of the present disclosure. The power module 10 is a semiconductor device driving a three-phase motor 11 and includes HVICs 21 to 23, an LVIC 24, a bridge circuit 30 for power conversion, and terminals HU, HV, HW, LU, LV, LW, P, U, V, W, NU, NV, and NW.

The bridge circuit 30 includes insulated gate bipolar transistors (IGBTs) 31 to 36 and free wheeling diodes (FWDs) 41 to 46. The IGBTs 31 to 36 are each provided with a sense IGBT that detects a current flowing through the corresponding one of the IGBTs 31 to 36; however, for the sake of convenience, the sense IGBT is omitted in this Figure.

The IGBTs 31 and 32 are U-phase switching devices, and the IGBTs 31 and 32 are provided with the FWDs 41 and 42, respectively.

The IGBTs 33 and 34 are V-phase switching devices, and the IGBTs 33 and 34 are provided with the FWDs 43 and 44, respectively.

The IGBTs 35 and 36 are W-phase switching devices, and the IGBTs 35 and 36 are provided with the FWDs 45 and 46, respectively.

A power source voltage Vdc is applied from a direct-current power source 13 to the terminal P, while a three-phase motor 11 as a load is provided for the terminals U, V, and W. The terminals NU, NV, and NW are grounded.

A capacitor 12 to stabilize the power source voltage Vdc is coupled between the terminal P and the terminals NU, NV, and NW.

Each of the high voltage integrated circuits (HVICs) 21 to 23 is an integrated circuit to switch the IGBTs 31, 33, and 35 in the upper arm according to driving signals Vhdru, Vhdrv, and Vhdrw from a microcomputer (not illustrated) that are inputted through the terminals HU, HV, and HW.

The low voltage integrated circuit (LVIC) 24 is an integrated circuit to switch the IGBTs 32, 34, and 36 in the lower arm according to driving signals Vldru, Vldrv, and Vldrw from the microcomputer (not illustrated) that are inputted through the terminals LU, LV, and LW.

The driving signals Vhdru, Vhdrv, and Vhdrw that are PWM-controlled with the varying duty ratio are inputted from the microcomputer (not illustrated) to the terminals HU, HV, and HW, respectively. The driving signals Vhdru, Vhdrv, and Vhdrw are signals that respectively turn on the IGBTs 31, 33, and 35 when the signals are at a high level (hereinafter, referred to as the "H" level) and respectively turn off the IGBTs 31, 33, and 35 when the signals are at a low level (hereinafter, referred to as the "L" level).

The driving signals Vldru, Vldrv, and Vldrw that are PWM-controlled are inputted to the terminals LU, LV, and LW, respectively. The driving signals Vldru, Vldrv, and Vldrw are signals that respectively turn on the IGBTs 32, 34, and 36, when the signals are at the "L" level and respectively turn off the IGBTs 32, 34, and 36 when the signals are at the "H" level.

The IGBTs 31 and 32 are complementarily driven by the driving signals Vhdru and Vldru, the IGBTs 33 and 34 are complementarily driven by the driving signals Vhdrv and Vldrv, and the IGBTs 35 and 36 are complementarily driven by the driving signals Vhdrw and Vldrw.

The microcomputer (not illustrated) of an embodiment of the present disclosure changes the timings and the duty ratios of the driving signals Vhdru, Vhdrv, Vhdrw, Vldru, Vldrv, and Vldrw such that the currents flowing through the three-phase motor 11 have the form of a sine wave with phases that are different from each other by 120 degrees, for example.

Figure 2:
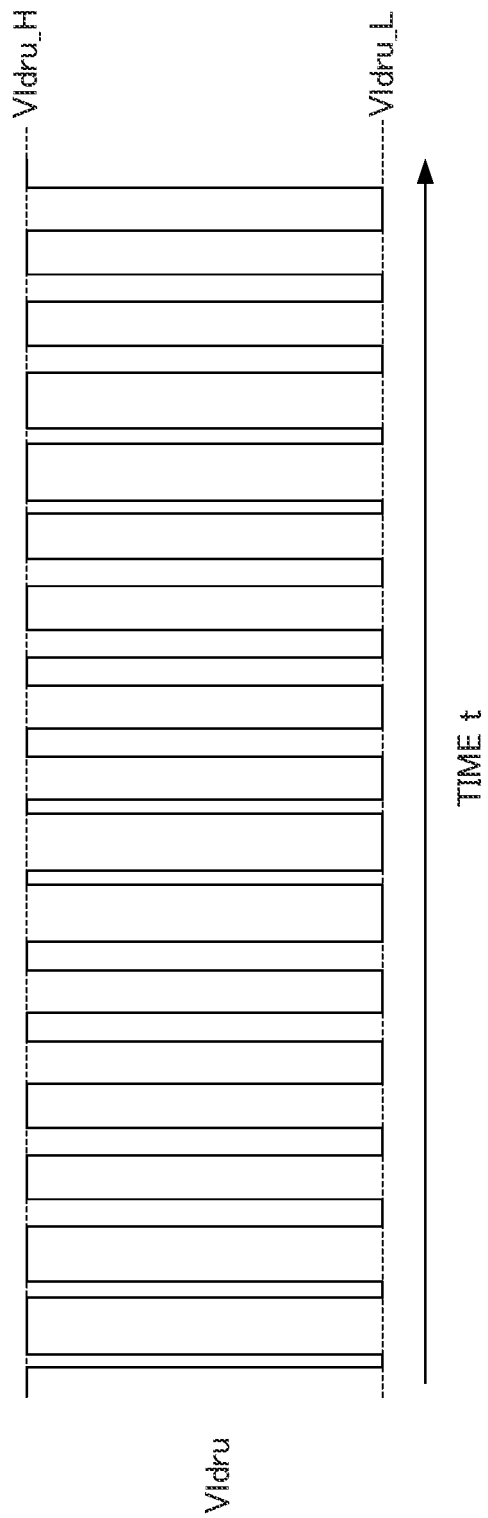
FIG. 2 is a diagram illustrating an example of a PWM-controlled driving signal Vldru.

As a result, a time period in which the driving signal Vldru is at the "L" level (that is, a time period in which the IGBT 32 is turned on) is changed as illustrated in FIG. 2.

A terminal COM is a terminal to which the ground voltage is applied and is, for example, coupled to a housing (not illustrated) or the like of the power module 10.

<<LVIC 24>>

Figure 3:
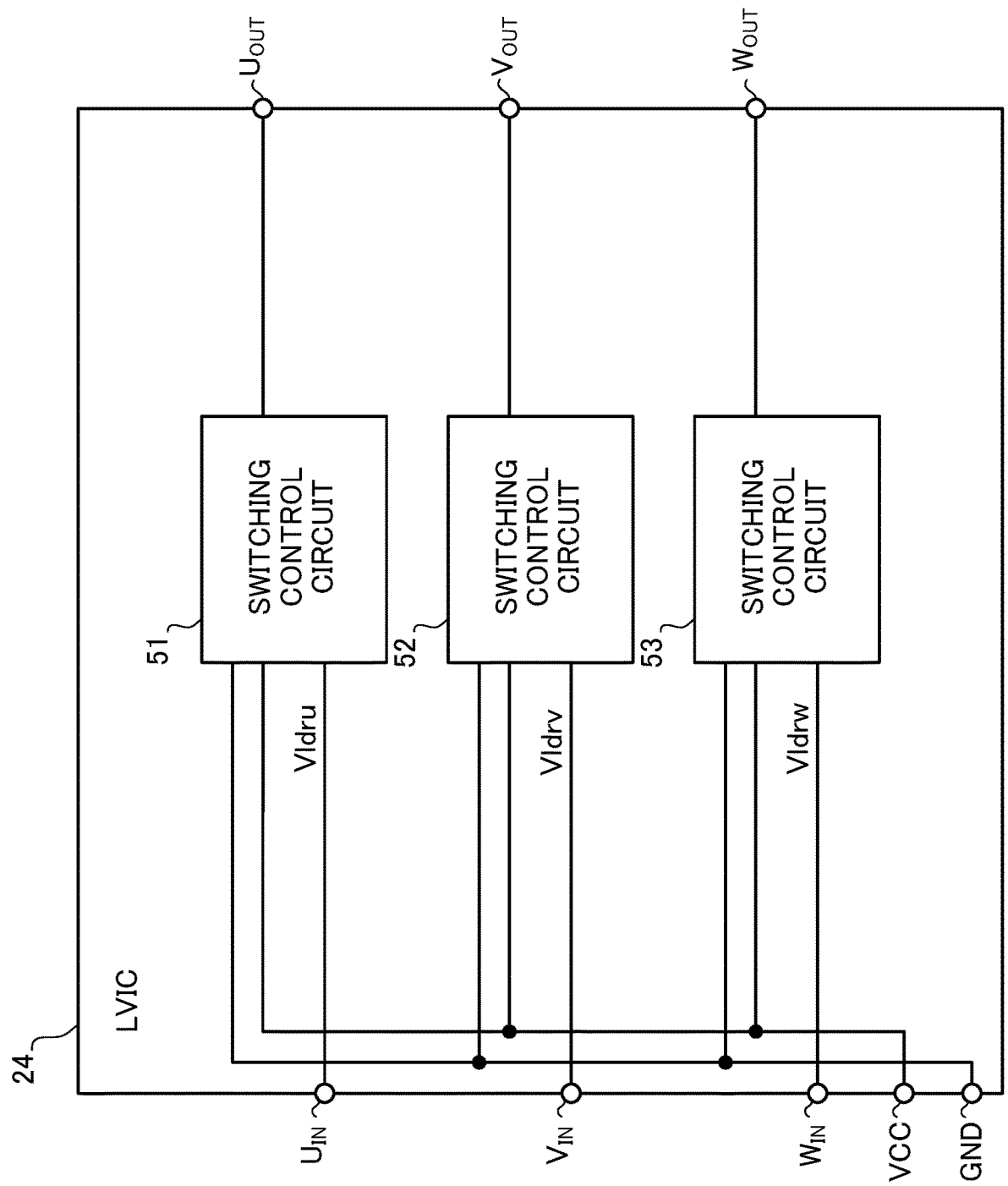
FIG. 3 is a diagram illustrating an example of a configuration of an LVIC 24.

FIG. 3 is a diagram illustrating an example of a configuration of the LVIC 24. The LVIC 24 includes switching control circuits 51 to 53. The switching control circuit 51 drives the IGBT 32 based on the driving signal Vldru inputted to a terminal UIN. The switching control circuit 52 drives the IGBT 34 based on the driving signal Vldrv inputted to a terminal VIN. The switching control circuit 53 drives the IGBT 36 based on the driving signal Vldrw inputted to a terminal WIN. Additionally, a power source voltage from a terminal VCC is applied to the switching control circuits 51 to 53, and also the ground voltage from a terminal GND is applied thereto. The switching control circuits 51 to 53 are formed of the same circuits.

<<Switching Control Circuit 51>>

Figure 4:
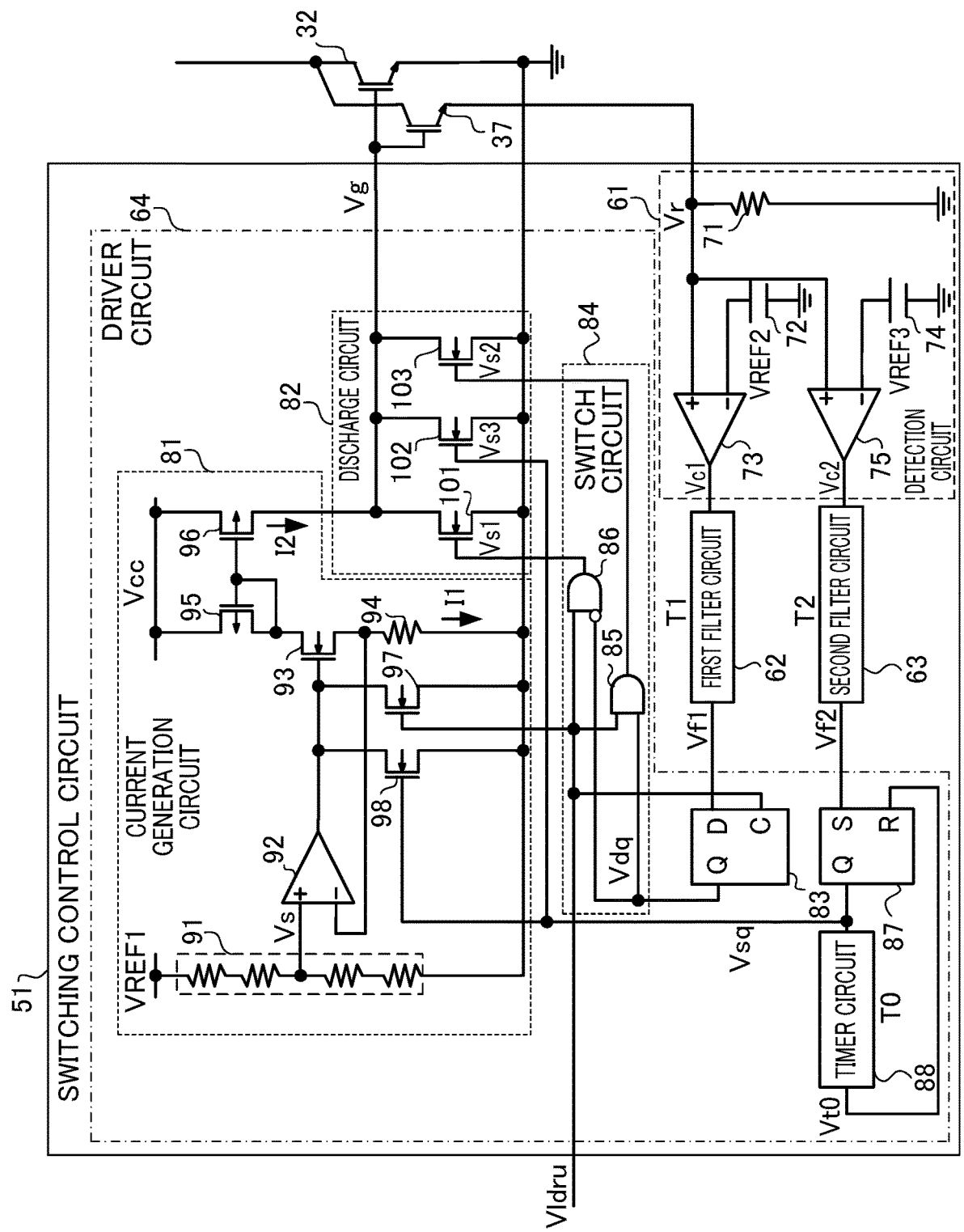
FIG. 4 is a diagram illustrating an example of a configuration of a switching control circuit 51.

FIG. 4 is a diagram illustrating an example of a configuration of the switching control circuit 51. The switching control circuit 51 includes a detection circuit 61, a first filter circuit 62, a second filter circuit 63, and a driving circuit 64.

<<<Detection Circuit 61>>>

The detection circuit 61 is a circuit to detect a current from an emitter terminal of an IGBT 37 for current sensing. The detection circuit 61 includes a resistor 71, reference voltage circuits 72 and 74, and comparators 73 and 75.

A voltage is applied to a gate terminal of the IGBT 37 equal to the voltage that is applied to a gate terminal of the IGBT 32, and a collector terminal of the IGBT 37 is coupled with a collector terminal of the IGBT 32. The ratio of the size of transistors between the IGBT 37 and the IGBT 32 is 1:10000, for example. Accordingly, a current that is approximately a ten-thousandth of a current flowing between the collector and an emitter in the IGBT 32 flows between the collector and the emitter in the IGBT 37. Therefore, a current is outputted from the emitter terminal of the IGBT 37 in accordance with the current flowing through the IGBT 32, and the current outputted from the emitter terminal of the IGBT 37 is detected in order to detect the overcurrent state of the IGBT 32.

When the current from the IGBT 37 flows into the resistor 71, the resistor 71 generates a voltage Vr according to the current on one end. The other end of the resistor 71 is grounded. For the sake of convenience, the description is given assuming that only one resistor 71 is provided; however, if there are multiple IGBTs 37 to sense the current flowing through the IGBT 32, multiple resistors 71 may be provided for the corresponding IGBTs 37, respectively. When there are multiple resistors 71, voltages Vr that are generated by the different resistors 71 may be each applied to a non-inverting input terminal of corresponding one of the multiple comparators.

The reference voltage circuit 72 is, for example, a circuit that generates a reference voltage VREF2 from the power source voltage Vcc and supplies the comparator 73 with the reference voltage VREF2. Likewise, the reference voltage circuit 74 generates a reference voltage VREF3. The reference voltage VREF2 and the reference voltage VREF3 are at the same voltage level in an embodiment of the present disclosure; however, they may be at different voltage levels.

The comparator 73 is a circuit that detects the overcurrent state by comparing the voltage Vr with the reference voltage VREF2 and outputting an output signal Vc1. In the comparator 73, the voltage Vr is applied to a non-inverting input terminal, and the reference voltage VREF2 generated by the reference voltage circuit 72 is applied to an inverting input terminal. The reference voltage VREF2 is set to be equal to the voltage Vr, which is generated by the resistor 71 when a predetermined current indicating an overcurrent flows from the IGBT 37 into the resistor 71.

When the current from the IGBT 37 flows into the resistor 71, and the voltage Vr becomes higher than the reference voltage VREF2, the comparator 73 outputs the output signal Vc1 at the "H" level. On the other hand, when the current from the IGBT 37 flows into the resistor 71, and the voltage Vr becomes lower than the reference voltage VREF2, the comparator 73 outputs the output signal Vc1 at the "L" level. That is, the comparator 73 compares the current flowing through the IGBT 32 with the predetermined current indicating an overcurrent, and if the current flowing through the IGBT 32 is greater than the predetermined current, the comparator 73 outputs the output signal Vc1 indicating that the current flowing through the IGBT 32 is in the overcurrent state.

Likewise, in the comparator 75, the voltage Vr is applied to a non-inverting input terminal, and the reference voltage VREF3 generated by the reference voltage circuit 74 is applied to an inverting input terminal. Consequently, the comparator 75 operates similarly as the comparator 73 does.

Thus, the detection circuit 61 detects whether the current flowing through the IGBT 32 is in the overcurrent state.

The descriptions are given assuming that the detection circuit 61 includes the comparators 73 and 75. However, since the reference voltage VREF2 and the reference voltage VREF3 are at the same voltage level in an embodiment of the present disclosure, the detection circuit 61 may include only one comparator instead of including the comparators 73 and 75. In such a case, an output signal from the single comparator may be inputted to a first filter circuit 62 and a second filter circuit 63 described later. The gate terminal of the IGBT 32 corresponds to a "control electrode". The comparator 73 corresponds to a "first comparison circuit", and the comparator 75 corresponds to a "second comparison circuit". The output signal Vc1 corresponds to a "first comparison result", and the output signal Vc2 corresponds to a "second comparison result". The predetermined current indicating an overcurrent corresponds to a "first current value", a "second current value", or a "predetermined current".

<<<First Filter Circuit 62>>>

The first filter circuit 62 is a circuit that outputs an output signal Vf1 when the output signal Vc1 from the comparator 73 is outputted for a time period longer than a "first time period T1". The "first time period T1" is longer than a time period in which noise is occurring in response to turning-on of the IGBT 32. The output signal Vf1 reaches the "L" level when the output signal Vc1 reaches the "L" level.

That is, when the IGBT 32 is turned on, and an overcurrent flows through the IGBT 32 during the "first time period T1", the output signal Vf1 reaches the "H" level, and thereafter, when the IGBT 32 is turned off, and no more overcurrent flows through the IGBT 32, the output signal Vf1 reaches the "L" level.

Therefore, the first filter circuit 62 outputs the output signal Vf1 indicating whether the time period of the overcurrent state is longer than the "first time period T1" based on the output signal Vc1 detecting whether the current flowing through the IGBT 32 is in the overcurrent state. The first filter circuit 62 corresponds to a "first signal output circuit". The output signal Vf1 corresponds to a "first signal".

<<<Second Filter Circuit 63>>>

The second filter circuit 63 is a circuit that outputs an output signal Vf2 when the output signal Vc2 from the comparator 75 is outputted for a time period longer than a "second time period T2". The "second time period T2" is longer than the "first time period T1". The output signal Vf2 reaches the "L" level when the output signal Vc2 reaches the "L" level.

That is, when the IGBT 32 is turned on, and an overcurrent flows through the IGBT 32 during the "second time period T2", the output signal Vf2 reaches the "H" level, and thereafter, when the IGBT 32 is turned off, and no more overcurrent flows through the IGBT 32, the output signal Vf2 reaches the "L" level.

Therefore, the second filter circuit 63 outputs the output signal Vf2 indicating whether the time period of the overcurrent state is longer than the "second time period T2" based on the output signal Vc2 detecting whether the current flowing through the IGBT 32 is in the overcurrent state. The second filter circuit 63 corresponds to a "second signal output circuit". The output signal Vf2 corresponds to a "second signal".

<<<Driving Circuit 64>>>

The driving circuit 64 is a circuit that turns on or off the IGBT 32 based on the output signals Vf1 and Vf2 and the driving signal Vldru. The driving circuit 64 includes a current generation circuit 81, a discharge circuit 82, a D flip-flop 83, a switch circuit 84, an SR flip-flop 87, and a timer circuit 88.

<<<<Current Generation Circuit 81>>>>

The current generation circuit 81 is a circuit to generate a current that charges the capacity of the gate terminal of the IGBT 32. The current generation circuit 81 includes a voltage-dividing circuit 91, an operational amplifier 92, NMOS transistors 93, 97, and 98, a resistor 94, and PMOS transistors 95 and 96.

A reference voltage Vs generated by the voltage-dividing circuit 91 based on a reference voltage VREF1 is applied to a non-inverting input terminal of the operational amplifier 92. An inverting input terminal of the operational amplifier 92 is coupled with one end of the resistor 94 detecting a current I1 flowing through the NMOS transistor 93 and the PMOS transistor 95, and with a source terminal of the NMOS transistor 93.

A current is supplied to the NMOS transistor 93 from the diode-connected PMOS transistor 95. The operational amplifier 92 controls the NMOS transistor 93 such that a voltage of the inverting input terminal reaches the reference voltage Vs that is applied to the non-inverting input terminal.

As a result, the current I1 that is determined based on the reference voltage Vs and a resistance value of the resistor 94 flows through the diode-coupled PMOS transistor 95.

The PMOS transistors 95 and 96 form a current mirror circuit. Therefore, a current I2 according to the current I1 flowing through the PMOS transistor 95 flows through the PMOS transistor 96.

When at least one of the NMOS transistors 97 and 98 is turned on, the ground voltage is applied to a gate terminal of the NMOS transistor 93, and as a result, the NMOS transistor 93 is turned off, and the currents I1 and I2 do not flow. On the other hand, when the driving signal Vldru and an output signal Vsq from the SR flip-flop 87 described later are at the "L" level, the currents I1 and I2 flow, and the IGBT 32 is turned on. The driving signal Vldru at the "L" level (i.e., "Vldru_L") corresponds to a "first input signal", and the driving signal Vldru at the "H" level (i.e., "Vldru_H") corresponds to a "second input signal".

<<<<Discharge Circuit 82>>>>

The discharge circuit 82 is a circuit that applies the ground voltage to the gate terminal of the IGBT 32 and turns off the IGBT 32. The discharge circuit 82 includes NMOS transistors 101, 102, and 103.

In each of the NMOS transistors 101, 102, and 103, a drain terminal is coupled to the gate terminal of the IGBT 32, and a source terminal is grounded. Voltages Vs1, Vs2, and Vs3, which are controlled based on the driving signal Vldru, an output signal Vdq from the D flip-flop 83 described later, and the output signal Vsq from the SR flip-flop 87, respectively, are applied to the gate terminals of the NMOS transistors 101, 102, and 103, respectively; details are described later. In an embodiment of the present disclosure, the on-resistances of the NMOS transistors 102 and 103 are greater than the on-resistance of the NMOS transistor 101. The NMOS transistor 101 corresponds to a "first switch", the NMOS transistor 103 corresponds to a "second switch", and the NMOS transistor 102 corresponds to a "third switch".

<<<<D Flip-Flop 83>>>>

The D flip-flop 83 is a circuit to hold the output signal Vf1 from the first filter circuit 62 at a rising edge of the driving signal Vldru (that is, a timing in which the IGBT 32 is switched from on to off) and output the output signal Vdq. The D flip-flop 83 corresponds to a "first holding circuit".

<<<<Switch Circuit 84>>>>

The switch circuit 84 is a circuit to control the voltages Vs1 and Vs2 based on the logic level of the output signal Vdq from the D flip-flop 83 and control the NMOS transistors 101 and 103. The switch circuit 84 includes AND elements 85 and 86.

When the output signal Vdq is at the "H" level, that is, when the time period of the overcurrent state is longer than the "first time period T1", the AND element 85 controls the voltage Vs2 driving the NMOS transistor 103 based on the driving signal Vldru and controls the IGBT 32 through the NMOS transistor 103. On the other hand, when the output signal Vdq is at the "L" level, that is, when the time period of the overcurrent state is shorter than the "first time period T1", the AND element 85 sets the voltage Vs2 to the "L" level and turns off the NMOS transistor 103.

When the output signal Vdq is at the "H" level, that is, when the time period of the overcurrent state is longer than the "first time period T1", the voltage Vs1 is at the "L" level, and the AND element 86 turns off the NMOS transistor 101. On the other hand, when the output signal Vdq is at the "L" level, that is, when the time period of the overcurrent state is shorter than the "first time period T1", the AND element 86 controls the NMOS transistor 101 based on the driving signal Vldru and controls the IGBT 32 through the NMOS transistor 101.

<<<<SR Flip-Flop 87 and Timer Circuit 88>>>>

The SR flip-flop 87 sets the output signal Vsq to the "H" level when a pulse signal is outputted from the second filter circuit 63 as the output signal Vf2. The output signal Vsq is inputted to the timer circuit 88, and the timer circuit 88 delays the output signal Vsq by a "predetermined time T0" and outputs an output signal Vt0. When the output signal Vt0 is outputted, the SR flip-flop 87 is reset, and as a result, the SR flip-flop 87 outputs the output signal Vsq at the "L" level. That is, when the time period in which the output signal Vsq is at the "H" level becomes longer than the "predetermined time T0", the output signal Vt0 is outputted, and the output signal Vsq is reset to the "L" level. The timer circuit 88 corresponds to a "reset circuit", and the "predetermined time T0" corresponds to a "predetermined time period".

The output signal Vsq is inputted to a gate terminal of the NMOS transistor 98 of the current generation circuit 81 and a gate terminal of the NMOS transistor 102 of the discharge circuit 82. When the output signal Vsq is at the "H" level, the NMOS transistor 98 is turned on and stops generating the current I2, the NMOS transistor 102 is then turned on, and the IGBT 32 is turned off regardless of the driving signal Vldru. While the output signal Vsq from the SR flip-flop 87 is maintained at the "H" level, the NMOS transistor 102 is being turned on. The SR flip-flop 87 corresponds to a "second holding circuit".

<Operations of Switching Control Circuit 51>

<<When Time Period of Overcurrent State is Shorter than "First Time Period T1" and "Second Time Period T2">>

Figure 5:
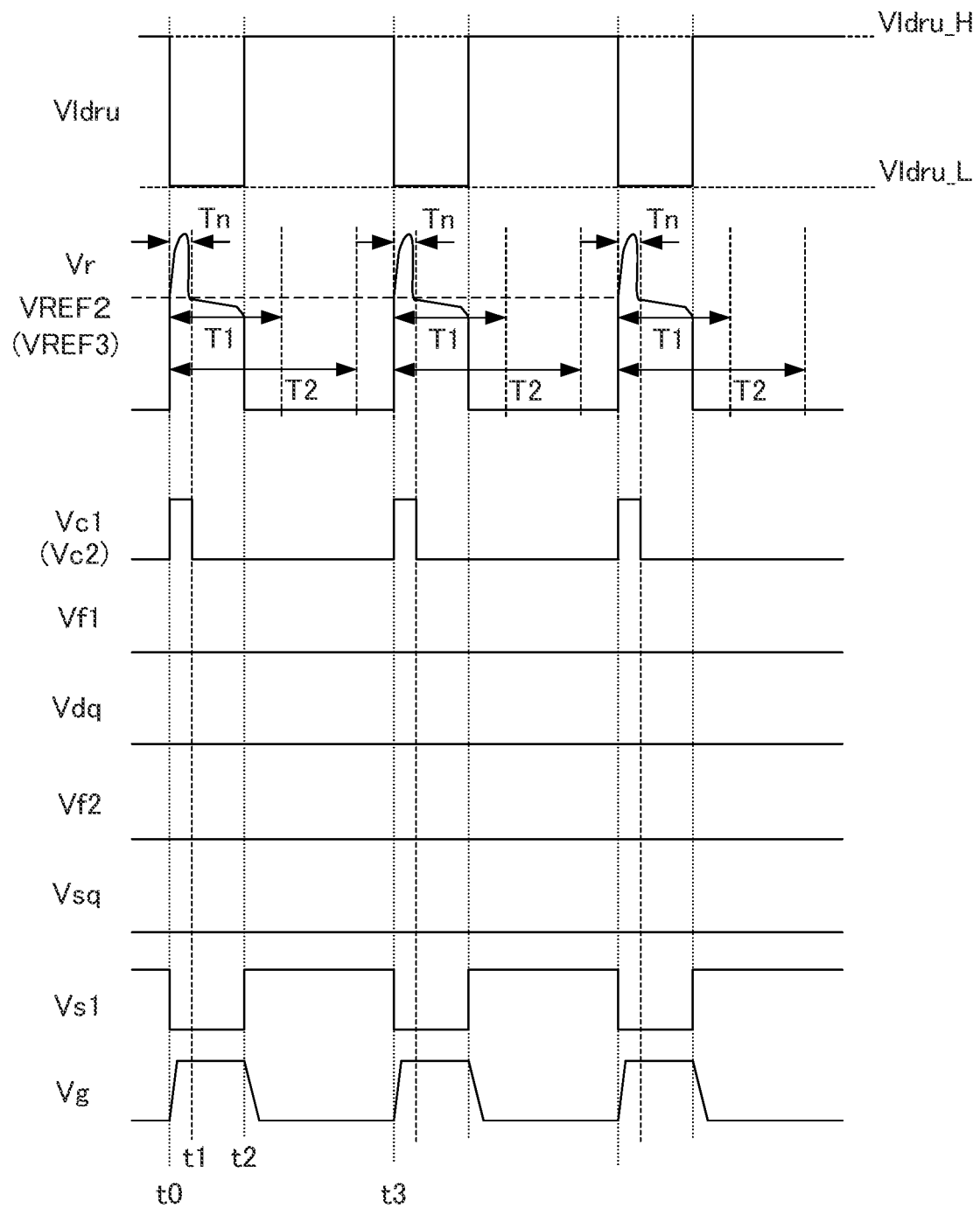
FIG. 5 is a diagram illustrating an example of operations of the switching control circuit 51.

FIG. 5 is a diagram illustrating an example of operations of the switching control circuit 51. Here, a case in which the time period of the overcurrent state is shorter than the "first time period T1" and the "second time period T2" is described. Before and at time t0, no overcurrent state occurs, and the output signal Vf1 from the first filter circuit 62 is maintained at the "L" level. Likewise, the output signal Vf2 from the second filter circuit 63 is maintained at the "L" level. The output signal Vdq from the D flip-flop 83 is at the "L" level because the output signal Vf1 is at the "L" level. Additionally, the output signal Vsq from the SR flip-flop 87 is reset in advance and is at the "L" level.

In this case, since the output signal Vdq is at the "L" level, the NMOS transistor 101 is controlled based on the driving signal Vldru, and the NMOS transistor 103 is being turned off. Since the output signal Vsq is at the "L" level, the NMOS transistors 98 and 102 are being turned off.

At the time t0, when the driving signal Vldru reaches the "L" level, the NMOS transistor 97 is turned off, and the current generation circuit 81 generates the current I2. Then, the signal Vs1 to be inputted to a gate terminal of the NMOS transistor 101 reaches the "L" level based on the driving signal Vldru, and the NMOS transistor 101 is turned off. Consequently, the current I2 from the current generation circuit 81 is supplied to the gate terminal of the IGBT 32. When the current I2 is supplied, a voltage Vg of the gate terminal of the IGBT 32 is increased at a constant slope. As a result, the IGBT 32 is turned on, and a current containing noise flows through the IGBT 32 and a parasitic component of the circuit. When the current containing noise flows, the voltage Vr generated by the resistor 71 temporarily becomes greater than the reference voltage VREF2. As a result, the output signals Vc1 and Vc2 from the comparators 73 and 75 reach the "H" level.

At time t1, since the noise responding to turning-on of the IGBT 32 disappears, the output signals Vc1 and Vc2 from the comparators 73 and 75 reach the "L" level. In this case, since the time period in which the output signal Vc1 is at the "H" level is shorter than the "first time period T1", the output signal Vf1 is maintained at the "L" level, and as a result, the output signal Vdq is maintained at the "L" level. Likewise, since the time period in which the output signal Vc2 is at the "H" level is shorter than the "second time period T2", the output signal Vf2 is maintained at the "L" level. Accordingly, the output signal Vsq is maintained at the "L" level. The time period from the time t0 to t1 is a "noise time period Tn" and corresponds to a "time period in which noise is occurring in response to turning-on of the switching device".

At time t2, when the driving signal Vldru reaches the "H" level, although the NMOS transistor 98 is still being turned off, the NMOS transistor 97 is turned on; therefore, the current generation circuit 81 stops generating the current I2. Then, the signal Vs1 to be inputted to the gate terminal of the NMOS transistor 101 reaches the "H" level based on the driving signal Vldru, and the NMOS transistor 101 is turned on. Since the output signal Vsq is at the "L" level, and the output signal from the AND element 85 is at the "L" level, the NMOS transistors 102 and 103 are being turned off. Then, the gate terminal of the IGBT 32 is grounded through the NMOS transistor 101, and the IGBT 32 is turned off. As a result, the voltage Vr generated by the resistor 71 becomes the ground voltage.

At time t3, the driving signal Vldru reaches the "H" level again. Thereafter, the operations from the time t0 to t2 are repeated.

The driving signal Vldru at the "L" level corresponds to the "first input signal", and the driving signal Vldru at the "H" level corresponds to the "second input signal".

As described above, when no overcurrent flows through the IGBT 32, the switching control circuit 51 drives the IGBT 32 based on the driving signal Vldru.

<<When Time Period of Overcurrent State is Longer than "First Time Period T1" but Shorter than "Second Time Period T2">>

Figure 6:
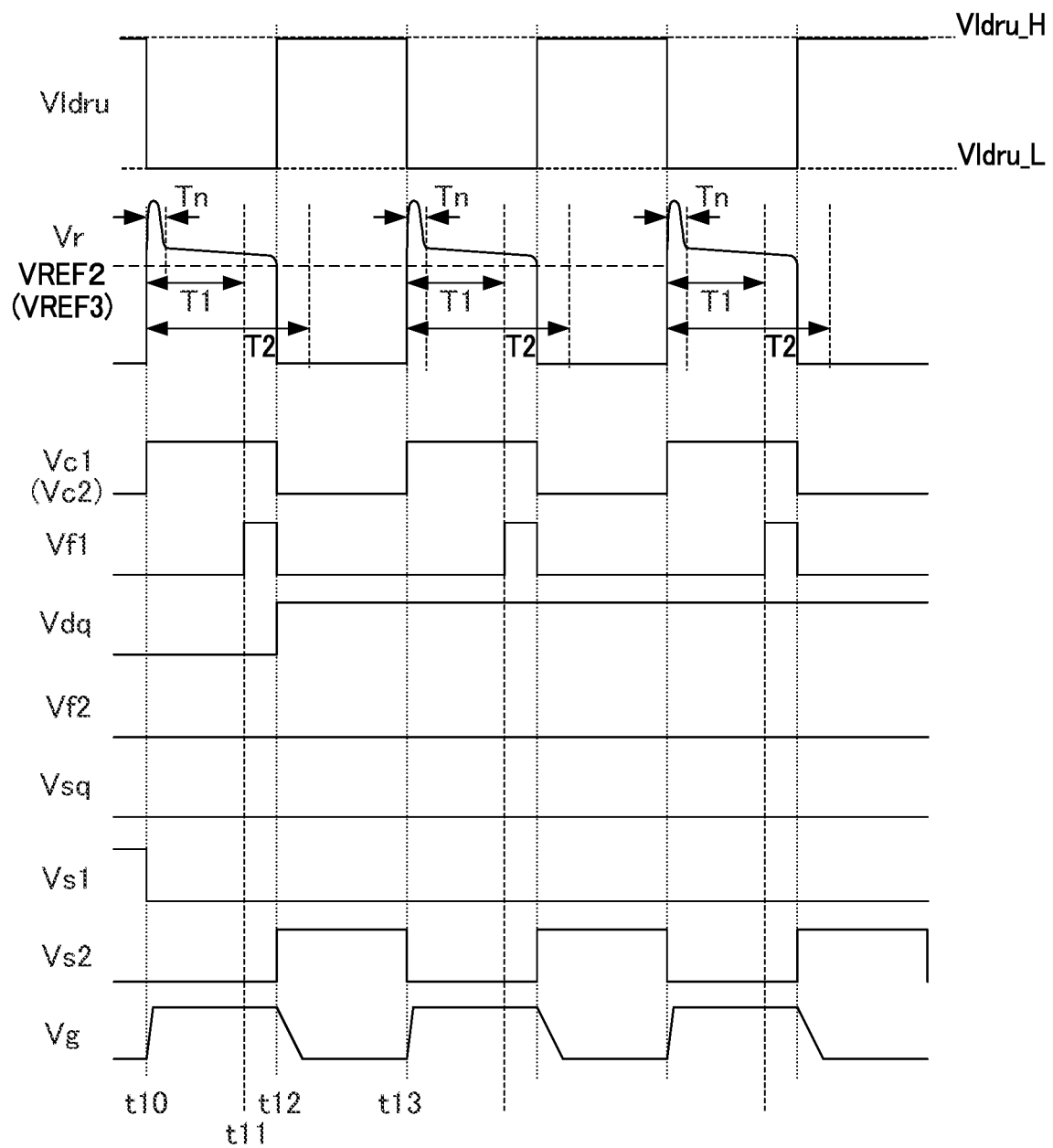
FIG. 6 is a diagram illustrating an example of operations of the switching control circuit 51.

FIG. 6 is a diagram illustrating an example of operations of the switching control circuit 51. Here, a case in which the time period of the overcurrent state is longer than the "first time period T1" but shorter than the "second time period T2" is described. The state of the switching control circuit 51 before and at time t10 is similar to the state before and at the time t0 in FIG. 5.

At the time t10, when the driving signal Vldru reaches the "L" level, the switching control circuit 51 operates similarly to the case of the time t0 in FIG. 5. As a result, the IGBT 32 is turned on, and the current containing noise flows through the IGBT 32.

At time t11, since an overcurrent flows through the IGBT 32, the output signal Vc1 is maintained at the "H" level from the time t10. When the time period of the overcurrent state exceeds the "first time period T1" from the time t10, the output signal Vf1 reaches the "H" level at the time t11. At this time, since the time period of the overcurrent state does not exceed the "second time period T2", the output signal Vf2 is maintained at the "L" level.

At time t12, when the driving signal Vldru reaches the "H" level, the D flip-flop 83 holds the signal Vf1 and sets the output signal Vdq to the "H" level. Then, the NMOS transistor 97 is turned on, and the current generation circuit 81 stops generating the current I2. Then, since the output signal from the AND element 86 reaches the "L" level, the output signal from the AND element 85 reaches the "H" level, and the signal Vs2 to be inputted to a gate terminal of the NMOS transistor 103 reaches the "H" level instead of turning on the NMOS transistor 101. Then, the gate terminal of the IGBT 32 is grounded through the NMOS transistor 103, and the IGBT 32 is turned off. As a result, the voltage Vr generated by the resistor 71 becomes the ground voltage.

When the driving signal Vldru reaches the "H" level, the IGBT 32 is turned off, and the current flowing through the IGBT 32 disappears; however, the output signal Vf1 indicating that an overcurrent is flowing through the IGBT 32 does not reach the "L" level immediately, and the D flip-flop 83 can hold the output signal Vf1.

Additionally, since the on-resistance of the NMOS transistor 103 is greater than the on-resistance of the NMOS transistor 101, the amount of change per unit time in a voltage of the gate terminal of the IGBT 32 when the IGBT 32 is turned off by the NMOS transistor 103 is smaller than that in a case in which the IGBT 32 is turned off by the NMOS transistor 101. Consequently, the amount of change per unit time of the current flowing through the IGBT 32 when the IGBT 32 is turned off is reduced, and the breakage of the IGBT 32 due to a surge voltage can be prevented.

At time t13, the driving signal Vldru reaches the "L" level again. Thereafter, the operations from the time t10 to t12 are repeated. However, since the time period of the overcurrent state exceeds the "first time period T1" every time the IGBT 32 is turned on, the output signal Vdq from the D flip-flop 83 is maintained at the "H" level at and after the time t13.

Thus, when the time period of the overcurrent state is longer than the "first time period T1" but shorter than the "second time period T2", the switching control circuit 51 turns on the IGBT 32 based on the driving signal Vldru and turns off the IGBT 32 through the NMOS transistor 103.

<<When Time Period of Overcurrent State is Longer than "First Time Period T1" and "Second Time Period T2">>

Figure 7:
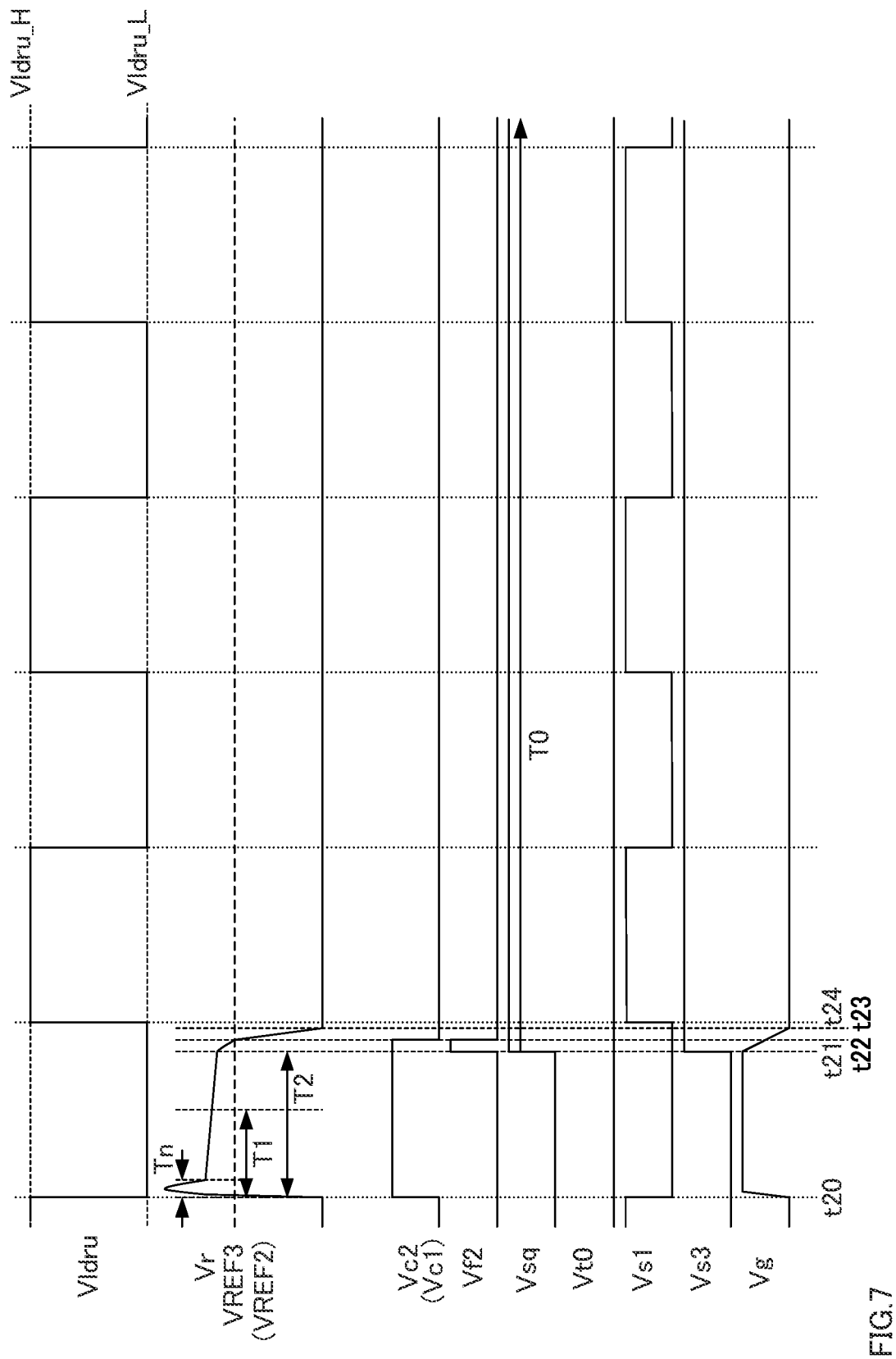
FIG. 7 is a diagram illustrating an example of operations of the switching control circuit 51.

FIG. 7 is a diagram illustrating an example of operations of the switching control circuit 51. Here, a case in which the time period of the overcurrent state is longer than the "first time period T1" and the "second time period T2" is described. The state of the switching control circuit 51 before and at time t20 is similar to the state before and at the time t0 in FIG. 5.

At the time t20, when the driving signal Vldru reaches the "L" level, the switching control circuit 51 operates similarly to the case of the time t0 in FIG. 5. As a result, the IGBT 32 is turned on, the current containing noise flows through the IGBT 32, and the output signal Vc2 reaches the "H" level.

At time t21, when the time period of the overcurrent state exceeds the "first time period T1" and the "second time period T2", the output signals Vf1 and Vf2 reach the "H" level, and the output signal Vsq from the SR flip-flop 87 reaches the "H" level. As a result, the NMOS transistor 98 is turned on, and the current generation circuit 81 stops generating the current I2. Then, since the output signal Vsq is at the "H" level, the voltage Vs3 to be inputted to a gate terminal of the NMOS transistor 102 reaches the "H" level, and the NMOS transistor 102 is turned on. Since the output signal from the AND element 86 is at the "L" level, the NMOS transistor 101 is being turned off, and since the output signal from the AND element 85 is at the "L" level, the NMOS transistor 103 is being turned off. As a result, the gate terminal of the IGBT 32 is grounded through the NMOS transistor 102, and the IGBT 32 is turned off.

Additionally, since the on-resistance of the NMOS transistor 102 is greater than the on-resistance of the NMOS transistor 101, the amount of change per unit time in a voltage of the gate terminal of the IGBT 32 when the IGBT 32 is turned off by the NMOS transistor 102 is smaller than that in a case in which the IGBT 32 is turned off by the NMOS transistor 101. Consequently, the amount of change per unit time of the current flowing through the IGBT 32 when the IGBT 32 is turned off is reduced, and the breakage of the IGBT 32 due to a surge voltage can be prevented.

At time t22, when the voltage Vr generated by the resistor 71 becomes lower than the reference voltage VREF3, the output voltage Vc2 reaches the "L" level, and the output voltage Vf2 also reaches the "L" level.

At time t23, when the IGBT 32 is turned off, the voltage Vr generated by the resistor 71 becomes the ground voltage.

At time t24, although the driving signal Vldru reaches the "H" level, the output signal Vf1 reaches the "L" level as with the output signal Vf2; therefore, the output signal Vdq is maintained at the "L" level.

Until the "predetermined time T0" elapses from the time t21, the output signal Vsq is maintained at the "H" level; therefore, even when the driving signal Vldru reaches the "L" level, the IGBT 32 is not turned on, and the voltage Vr remains at the ground voltage.

When the "predetermined time T0" elapses, and the output signal Vsq is reset, the switching control circuit 51 operates, again, based on whether the time period of the overcurrent state is longer than the "first time period T1" or the "second time period T2".

Thus, when the time period of the overcurrent state is longer than the "second time period T2", the switching control circuit 51 turns off the IGBT 32 during the "predetermined time T0".

Consequently, the switching control circuit 51 can protect the IGBT 32 from an overcurrent.

===Others===

The switching control circuit 51 of an embodiment of the present disclosure is used in the LVIC 24; however, the switching control circuit 51 may be used in each of the HVICs 21 to 23 to protect the IGBTs 31, 33, and 35 from an overcurrent.

It is described that the switching control circuit 51 of an embodiment of the present disclosure is for protecting the IGBT 32 from an overcurrent; however, instead of an IGBT, a power MOSFET and the like can be protected from an overcurrent.

===Overview===

The power module 10 of an embodiment of the present disclosure is described above. The switching control circuit 51 switches whether to turn off the IGBT 32 by the NMOS transistor 101 or to turn off the IGBT 32 by the NMOS transistor 103 based on the output signal Vf1 from the first filter circuit 62. Since the on-resistance of the NMOS transistor 103 is greater than the on-resistance of the NMOS transistor 101, the amount of change per unit time of the current flowing through the IGBT 32 when the IGBT 32 is turned off is reduced, and as a result, a surge voltage when the IGBT 32 is turned off is prevented. Consequently, it is possible to properly protect the IGBT 32 from an overcurrent.

Additionally, when the time period of the overcurrent state is longer than the "first time period T1", the first filter circuit 62 sets the output signal Vf1 to the "H" level. By making this "first time period T1" longer than the time period in which noise is occurring in response to turning-on of the IGBT 32, it is possible to prevent the noise from being detected as an overcurrent.

Moreover, with the D flip-flop 83 holding the output signal Vf1 at the rising edge of the driving signal Vldru of the first filter circuit 62, it is possible to properly detect the state of the current flowing through the IGBT 32 for the overcurrent protection when the IGBT 32 is turned off.

Furthermore, when the time period of the overcurrent state is longer than the "second time period T2", which is longer than the "first time period T1", the switching control circuit 51 turns off the IGBT 32 regardless of the driving signal Vldru. This prevents the breakage of the IGBT 32 due to an overcurrent flowing through the IGBT 32 for a long time period.

Additionally, the SR flip-flop 87 holds the output signal Vf2 from the second filter circuit 63 and outputs the output signal Vsq at the "H" level. In response to this output, the switching control circuit 51 turns off the IGBT 32 not with the NMOS transistor 101 but with the NMOS transistor 102, which includes the greater on-resistance than that of the NMOS transistor 101. Thus, the amount of change per unit time of the current flowing through the IGBT 32 when the IGBT 32 is turned off is reduced, and as a result, a surge voltage when the IGBT 32 is turned off is prevented. Consequently, it is possible to properly protect the IGBT 32 from an overcurrent. Additionally, by notifying the microcomputer (not illustrated) of the output signal Vsq from the SR flip-flop 87, it is possible to notify the microcomputer (not illustrated) of that the time period of the overcurrent state continues longer than the "second time period T2". On the other hand, the microcomputer (not illustrated) that receives the notification can change the control over the power module 10 and resolve the overcurrent state.

Moreover, after receiving the output signal Vsq at the "H" level, the timer circuit 88 outputs the output signal Vt0 after the "predetermined time T0" elapses. The SR flip-flop 87 is reset based on this output signal Vt0. This allows the power module 10 to restart its operation after the "predetermined time T0" even when there occurs the overcurrent state. Consequently, a system in which the power module 10 is mounted runs without stopping operation.

Furthermore, if the detection circuit 61 includes the comparators 73 and 75, it is possible to change their detection values for a current value flowing through the IGBT 32, respectively, and it is possible to implement more proper overcurrent protection depending on applications.

Additionally, if the switching control circuit 51 includes the detection circuit 61, the first filter circuit 62, the second filter circuit 63, and the driving circuit 64, it is possible to implement the overcurrent protection more properly with the combination of the "first time period T1" measured by the first filter circuit 62 and the "second time period T2" measured by the second filter circuit 63.

Moreover, the power module 10 including the IGBT 32, the detection circuit 61, the first filter circuit 62, the second filter circuit 63, and the driving circuit 64 is favorable to protect the IGBT 32 from an overcurrent.

According to the present disclosure, it is possible to provide a switching control circuit that is capable of properly protecting a switching device from an overcurrent.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

What is claimed is:

1. A switching control circuit configured to control switching of a switching device, comprising:
a detection circuit configured to detect whether a current flowing through the switching device is in an overcurrent state;
a first signal output circuit configured to output a first signal indicating whether a time period of the overcurrent state is longer than a first time period;
a driving circuit including
a first switch,
a second switch having an on-resistance greater than that of the first switch, and
a first holding circuit, the driving circuit being configured to
turn on the switching device based on a first input signal to turn on the switching device,
turn off the switching device through the first switch based on a second input signal to turn off the switching device, when the time period of the overcurrent state is shorter than the first time period, and
receive the first signal from the first signal output circuit, hold the first signal in the first holding circuit when the second input signal is inputted, and turn off the switching device through the second switch based on the second input signal and the first signal, when the time period of the overcurrent state is longer than the first time period; and
a second signal output circuit configured to output a second signal indicating whether the time period of the overcurrent state is longer than a second time period, the second time period being longer than the first time period.

2. The switching control circuit according to claim 1, wherein
the first time period is longer than a time period in which noise occurs in response to turning-on of the switching device.

3. The switching control circuit according to claim 1, wherein
the first switch is provided between a control electrode of the switching device and a ground,
the second switch is provided between the control electrode of the switching device and the ground, and
the driving circuit further includes
a switch circuit configured to
turn on the first switch based on the second input signal when the first holding circuit holds the first signal indicating that the time period of the overcurrent state is shorter than the first time period, and
turn on the second switch based on the second input signal when the first holding circuit holds the first signal indicating that the time period of the overcurrent state is longer than the first time period.

4. The switching control circuit according to claim 1, further comprising: wherein the driving circuit turns off the switching device regardless of the first and second input signals upon detecting that the second signal indicates that the time period of the overcurrent state is longer than the second time period.

5. The switching control circuit according to claim 4, wherein the driving circuit further includes
a second holding circuit configured to hold the second signal, and
a third switch provided between a control electrode of the switching device and a ground, the third switch being configured to be turned on while the second holding circuit holds the second signal indicating that the time period of the overcurrent state is longer than the second time period.

6. The switching control circuit according to claim 5, wherein the driving circuit further includes
a reset circuit configured to reset a state of the second holding circuit when a time period in which the second holding circuit holds the second signal indicating that the time period of the overcurrent state is longer than the second time period exceeds a predetermined time period.

7. The switching control circuit according to claim 4, wherein
the detection circuit further includes
a first comparison circuit configured to
compare the current flowing through the switching device with a first current value, and
upon detecting that the current flowing through the switching device is greater than the first current value, output a first comparison result indicating that the current flowing through the switching device is in the overcurrent state, and
a second comparison circuit configured to
compare the current flowing through the switching device with a second current value, and
upon detecting that the current flowing through the switching device is greater than the second current value, output a second comparison result indicating that the current flowing through the switching device is in the overcurrent state,
the first signal output circuit outputs the first signal based on the first comparison result, and
the second signal output circuit outputs the second signal based on the second comparison result.

8. A switching control circuit configured to control switching of a switching device, comprising:
a detection circuit configured to detect an overcurrent state in which a current flowing through the switching device is greater than a predetermined current;
a first signal output circuit configured to output a first signal indicating whether a time period of the overcurrent state is longer than a first time period;
a second signal output circuit configured to output a second signal indicating whether the time period of the overcurrent state is longer than a second time period, the second time period being longer than the first time period; and
a driving circuit including
a first switch,
a second switch having an on-resistance greater than that of the first switch, and
a holding circuit,
the driving circuit being configured to drive the switching device based on
the first and second signals,
a first input signal to turn on the switching device, and
a second input signal to turn off the switching device, by
when the time period of the overcurrent state is longer than the second time period, turning off the switching device based on the second signal regardless of the first and second input signals,
when the time period of the overcurrent state is shorter than the first time period, turning on the switching device based on the first input signal, and turning off the switching device through the first switch based on the second input signal, and
when the time period of the overcurrent state is longer than the first time period but shorter than the second time period, receiving the first signal from the first signal output circuit, holding the first signal in the holding circuit when the second input signal is inputted, turning on the switching device based on the first input signal, and turning off the switching device through the second switch based on the first signal and the second input signal.

9. A semiconductor device, comprising:
a switching device;
a detection circuit configured to detect whether a current flowing through the switching device is in an overcurrent state;
a first signal output circuit configured to output a first signal indicating whether a time period of the overcurrent state is longer than a first time period;
a driving circuit including
a first switch,
a second switch having an on-resistance greater than that of the first switch, and
a holding circuit,
the driving circuit being configured to
turn on the switching device based on a first input signal to turn on the switching device,
turn off the switching device through the first switch based on a second input signal to turn off the switching device, when the time period of the overcurrent state is shorter than the first time period, and
receive the first signal from the first signal output circuit, hold the first signal in the holding circuit when the second input signal is inputted, and turn off the switching device through the second switch based on the second input signal and the first signal, when the time period of the overcurrent state is longer than the first time period; and
a second signal output circuit configured to output a second signal indicating whether the time period of the overcurrent state is longer than a second time period, the second time period being longer than the first time period.

* * * * *